United States Patent
Zhao et al.

(10) Patent No.: US 9,735,541 B1
(45) Date of Patent: Aug. 15, 2017

(54) CALIBRATION OF EXTERNAL-CAVITY TUNABLE LASERS

(71) Applicant: Google Inc., Mountain View, CA (US)

(72) Inventors: Xiangjun Zhao, Fremont, CA (US); Cedric Fung Lam, Belmont, CA (US); Steven Fong, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 745 days.

(21) Appl. No.: 14/293,480

(22) Filed: Jun. 2, 2014

(51) Int. Cl.
*H01S 5/14* (2006.01)
*H01S 5/0683* (2006.01)
*H01S 5/024* (2006.01)
*H01S 3/13* (2006.01)
*H01S 5/042* (2006.01)
*H01S 5/06* (2006.01)

(52) U.S. Cl.
CPC ............ *H01S 5/141* (2013.01); *H01S 3/1305* (2013.01); *H01S 5/024* (2013.01); *H01S 5/0427* (2013.01); *H01S 5/0612* (2013.01); *H01S 5/0683* (2013.01)

(58) Field of Classification Search
CPC ...... H01S 5/141; H01S 5/0683; H01S 5/0612; H01S 3/1305; H01S 5/0427
See application file for complete search history.

(56) References Cited

U.S. PATENT DOCUMENTS

| | | |
|---|---|---|
| 7,174,099 B1 | 2/2007 | Chinn et al. |
| 2003/0007540 A1* | 1/2003 | Daiber ................. H01S 5/141 372/92 |
| 2006/0045542 A1 | 3/2006 | Lee et al. |
| 2006/0140548 A1 | 6/2006 | Shin et al. |
| 2013/0182728 A1* | 7/2013 | Li ........................ H01S 5/141 372/20 |

FOREIGN PATENT DOCUMENTS

EP 2146443 A1 1/2010

* cited by examiner

*Primary Examiner* — Dung Nguyen
(74) *Attorney, Agent, or Firm* — Honigman Miller Schwartz and Cohn LLP (57) ABSTRACT

A method of calibrating a tunable laser includes shifting a filter output peak defined by a tunable optical feedback filter of the tunable laser in an optical spectral domain to align with a target etalon output peak of a plurality of spaced etalon output peaks defined by an etalon of the tunable laser. The method also includes shifting a cavity frequency grid defined by cavity modes of the tunable laser to align a target cavity mode of the cavity frequency grid with the filter output peak and shifting the spaced output peaks defined by the etalon to align a target etalon output peak with a target wavelength of an output wavelength grid. The method includes modifying a bias current and a modulation current of a gain section of the tunable laser to achieve a defined output modulation amplitude and a defined extinction ratio.

34 Claims, 9 Drawing Sheets

FIG. 1A

PRIOR ART

CALIBRATION OF EXTERNAL-CAVITY TUNABLE LASERS

TECHNICAL FIELD

This disclosure relates to the calibration of external-cavity tunable lasers.

BACKGROUND

Wavelength tunable lasers have many applications in telecommunications and optical sensing. Usually, a tunable laser will output a specific set of wavelengths (or frequencies) which can be selected on demand. Tunable lasers generally require a mechanism to control their output frequencies; and the parameters needed to set the output frequencies are usually characterized and stored in non-volatile memories during a calibration process. These parameters are later looked up and loaded for wavelength tuning during the operation of a tunable laser. The calibration process sometimes involves a multi-dimensional search, which could be a lengthy and time consuming process, and adds significant cost to the manufacturing of tunable lasers.

Figure 1A:
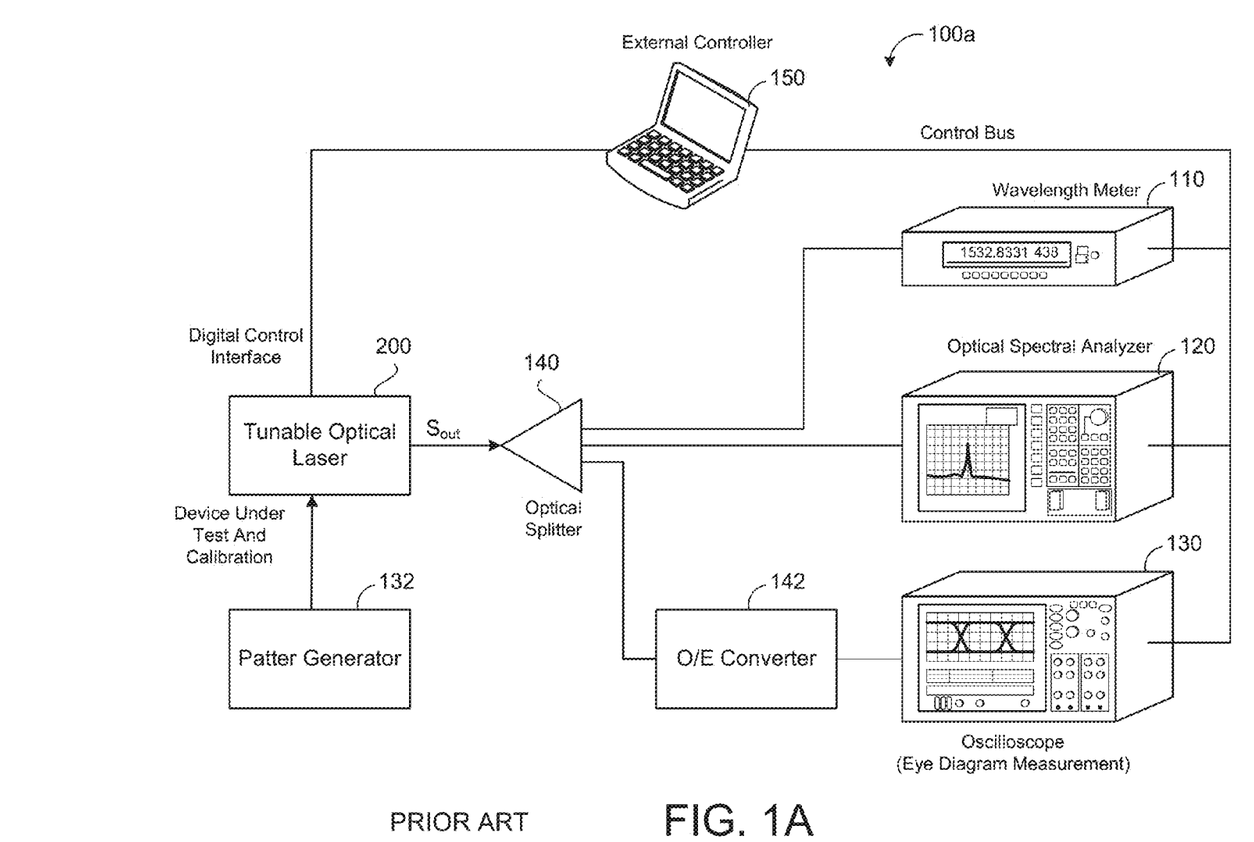
FIG. 1A is a schematic view of a conventional tunable laser calibration system.

Referring to FIG. 1A, a tunable laser calibration system 100a conventionally includes a wavelength analyzer 110, an optical spectrum analyzer 120, and an oscilloscope 130, each receiving an output signal Sout from a tunable laser 200. An optical splitter 140 splits the output signal Sout for delivery to the wavelength analyzer 110, the optical spectrum analyzer 120, and the oscilloscope 130. An optical/electrical converter 142 converts the optical signal Sout to an electrical signal for receipt by the oscilloscope 130. The calibration system 100a generally uses the optical spectrum analyzer 120 and the oscilloscope 130 to measure an output modulation amplitude (OMA) and an extinction ratio (ER) of a tunable laser 200. The calibration system 100a generally uses the wavelength analyzer 110 to calibrate a wavelength reference.

SUMMARY

The present disclosure provides, inter alia, a set of procedures to methodically calibrate an external cavity semiconductor tunable laser, which can be used in a telecommunication system as a directly modulated optical transmitter source. One aspect of the disclosure provides a method of calibrating a tunable laser. The method includes shifting a filter output peak defined by a tunable optical feedback filter of the tunable laser in an optical spectral domain to align with a target etalon output peak of a plurality of spaced etalon output peaks defined by an etalon of the tunable laser. The method also includes shifting a cavity frequency grid defined by cavity modes of the tunable laser to align a target cavity mode of the cavity frequency grid with the filter output peak. The cavity modes are defined by a total optical path length inside a resonant cavity of the tunable laser. The method also includes shifting the spaced output peaks defined by the etalon to align a target etalon output peak with a target wavelength of an output wavelength grid and modifying a bias current and a modulation current of a gain section of the tunable laser to achieve a defined output modulation amplitude and a defined extinction ratio.

Implementations of the disclosure may include one or more of the following features. In some implementations, the method includes aligning the filter output peak of the tunable optical feedback filter with an etalon output peak near the target wavelength of the output wavelength grid by monitoring an output wavelength of the tunable laser on an optical spectrum analyzer while maximizing the output power of the tunable laser by tuning a bias current to the tunable optical feedback filter. The method may include using a built-in monitoring photo-diode of the tunable laser to monitor the output power of the tunable laser.

In some implementations, the method further includes determining an offset between the target etalon output peak and the target wavelength of the output wavelength grid after the tunable optical feedback filter, the etalon peak and laser output mode are aligned in the optical spectrum. The method may include altering a temperature of the etalon to align an etalon wavelength grid corresponding to the etalon with the output wavelength grid using the determined offset and a temperature coefficient of the etalon. When the etalon wavelength grid and the output wavelength grid are aligned, the method includes storing the determined offset and the current temperature of the etalon in non-transitory (e.g., non-volatile) memory. In some examples, the method includes altering the temperature of the etalon to align the target etalon output peak with the target wavelength of the output wavelength grid.

In some implementations, the method includes biasing the tunable optical feedback filter with an electric current to shift the filter output peak defined by the tunable optical feedback filter to align the filter output peak with the target etalon output peak. In some examples, the method includes monitoring an optical output of the tunable laser using a photodiode of the laser while biasing the tunable optical feedback filter to identify a local maximum of output power of the tunable laser. The method may include altering a temperature of the resonant cavity of the tunable laser to shift the cavity frequency grid. In some examples, the method further includes determining alignment of the filter output peak, the target etalon output peak, and the target cavity mode as occurring when the tunable laser outputs its local maximum output power. When the filter output peak, the target etalon output peak, and the target cavity mode are aligned, the method may further include storing in non-transitory memory one or more of a bias current amount of the tunable optical feedback filter, a cavity temperature of the resonant cavity, and a temperature of the etalon.

In some implementations, a free spectral range of the etalon is $n \times f_{grid}$, where $f_{grid}$ is a laser output frequency separation of the output wavelength grid and n is an integer multiplier. The method may further include monitoring an output power of an optical output of the tunable laser at each wavelength of the output wavelength grid while varying a modulation current between a minimum modulation current and a maximum modulation current delivered to a gain section of the tunable laser. In some examples, the method includes determining the modulation current of the gain section of the tunable laser based on a relationship between the output power of the tunable laser and the modulation current applied to the gain section.

Another aspect of the disclosure provides a tunable laser system that includes a tunable optical feedback filter, an etalon, a gain section, a power monitor (e.g., a photodiode), and a controller. The etalon, the tunable optical feedback filter and the gain section are aligned in the same optical path. The power monitor monitors the output power from the tunable laser (e.g., tapping off a small amount of output power from the gain section using an optical splitter). The controller includes non-transitory memory and one or more data processing devices in communication with the non-transitory memory. The one or more data processing devices execute a calibration routine. The calibration routine includes shifting a filter output peak defined by a tunable optical feedback filter of the tunable laser in an optical spectral domain to align with a target etalon output peak of a plurality of spaced etalon output peaks defined by an etalon of the tunable laser. The calibration routine also includes shifting a cavity frequency grid defined by cavity modes of the tunable laser to align a target cavity mode of the cavity frequency grid with the filter output peak, the cavity modes defined by a total optical path length inside a resonant cavity of the tunable laser. The calibration routine also includes shifting the spaced output peaks defined by the etalon to align a target etalon output peak with a target wavelength of an output wavelength grid. The tunable optical feedback filter comprises a tunable mirror (e.g., micro-electro-mechanical system (MEMS) mirror) in optical communication with a grating.

In some implementations, the calibration routine includes determining an offset between the target etalon output peak and the target wavelength of the output wavelength grid. The calibration routine may also include altering a temperature of the etalon to align an etalon wavelength grid corresponding to the etalon with the output wavelength grid using the determined offset and a temperature coefficient of the etalon. The one or more data processing devices, which execute the calibration routine, alter the temperature of the etalon by causing delivery of a bias current to a temperature controller attached to the etalon. In some examples, when the etalon wavelength grid and the output wavelength grid are aligned, the calibration routine includes storing the determined offset and a current temperature of the etalon in non-transitory memory.

In some examples, the calibration routine includes biasing the tunable optical feedback filter with an electric current to shift the filter output peak defined by the tunable optical feedback filter to align the filter output peak with the target etalon output peak. The calibration routine may also include monitoring an optical output of the tunable laser, based on signals received by the controller from the power monitor, while biasing the tunable optical feedback filter to identify a local maximum of output power of the tunable laser. The calibration routine may include altering a temperature of the resonant cavity of the tunable laser to shift the cavity frequency grid. In some examples, the calibration routine includes determining alignment of the filter output peak, the target etalon output peak, and the target cavity mode as occurring when the tunable laser outputs its local maximum output power. When the filter output peak, the target etalon output peak, and the target cavity mode are aligned, the calibration routine includes storing in the non-transitory memory one or more of a bias current amount of the tunable optical feedback filter, a cavity temperature of the resonant cavity, and a temperature of the etalon.

In some implementations, the calibration routine includes monitoring an output power of an optical output of the tunable laser, based on signals received by the controller from the power monitor, at each wavelength of the output wavelength grid while varying a modulation current between a minimum modulation current and a maximum modulation current delivered to the gain section of the tunable laser. The calibration routine may further include determining the modulation current of the gain section of the tunable laser based on a relationship between the output power of the tunable laser and the bias current applied to the gain section.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 4B is a schematic view of a calibration state of the etalon modes of FIG. 3B. At this state, FIG. 4B is similar to FIG. 3B. The etalon modes are still not aligned to the desired output modes shown in FIG. 4D.

Like reference symbols in the various drawings indicate like elements.

DETAILED DESCRIPTION

Figure 1B:
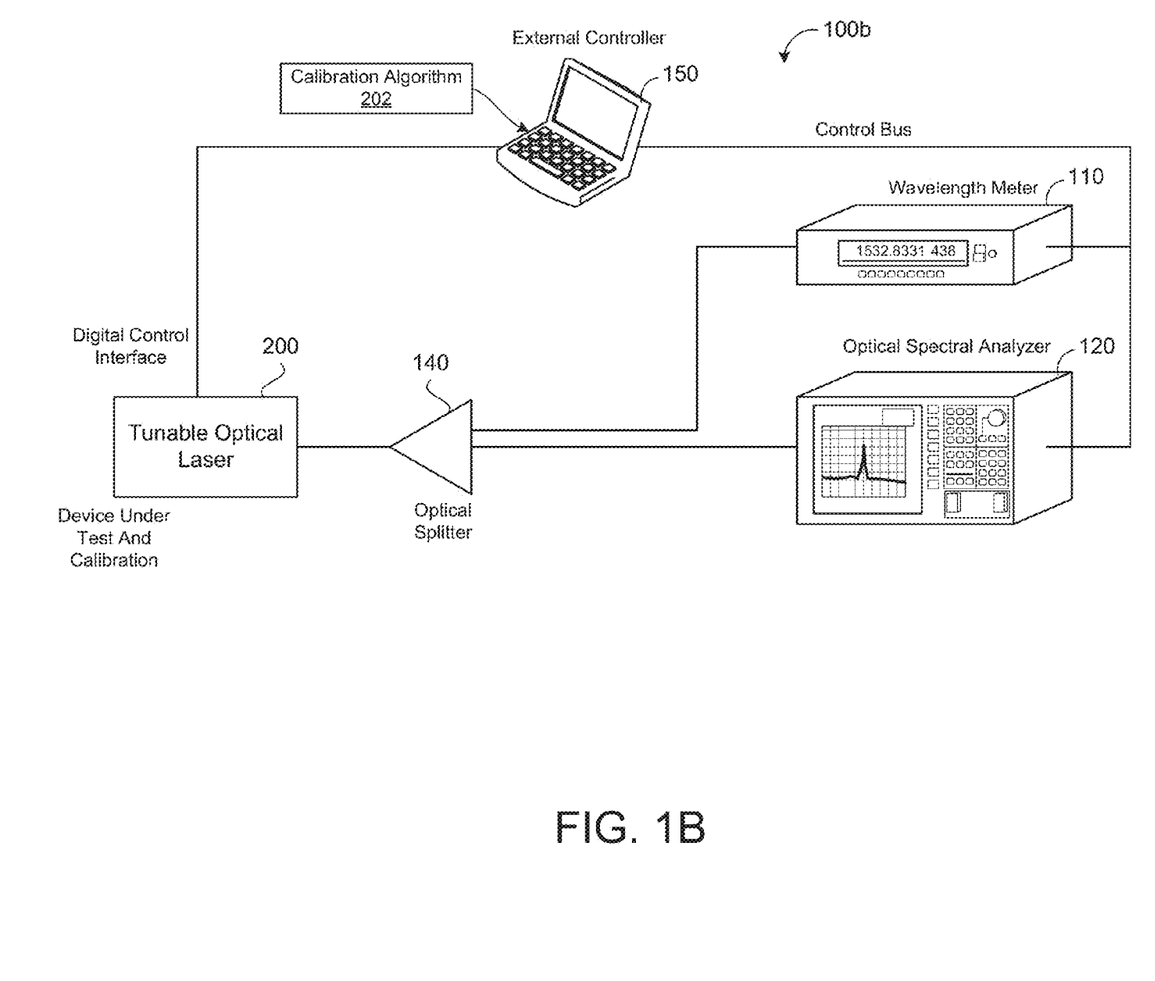
FIG. 1B is a schematic view of an exemplary tunable laser calibration system.

Referring to FIGS. 1A and 1B, unlike conventional calibration systems 100a that use an optical spectrum analyzer 120 and an oscilloscope 130 to measure an output modulation amplitude and an extinction ratio of the tunable laser 200, a calibration system 100b may determine the output modulation amplitude and the extinction ratio of the tunable laser 200 using an internal power monitor 250 (e.g., photodiode) of a tunable laser 200. As a result, the calibration system 100b does not need the oscilloscope 130. As such, in some implementations, the calibration system 100b includes a wavelength analyzer 110 and an optical spectrum analyzer 120, each receiving an output signal Sout from a tunable laser 200 (thus omitting the oscilloscope 130). An optical splitter 140 splits the output signal Sout for delivery to the wavelength analyzer 110 and the optical spectrum analyzer 120. The calibration system 100b may use the wavelength analyzer 110 to calibrate a wavelength reference or set a desired wavelength $\lambda_{out}$ of the tunable laser 200. The calibration system 100b also includes an external controller 150 (e.g., a computer) having a digital control interface in communication with the tunable laser 200, the wavelength analyzer 110, and the optical spectrum analyzer 120. The external controller 150 (FIG. 2) includes non-transitory memory 152 and one or more data processing devices 154 in communication with the memory 152.

Memory may be physical devices used to store programs (e.g., sequences of instructions) or data (e.g., program state information) on a temporary or permanent basis for use by a computing device (e.g., the one or more data processing devices 154). The non-transitory memory may be volatile and/or non-volatile addressable semiconductor memory. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

Figure 2:
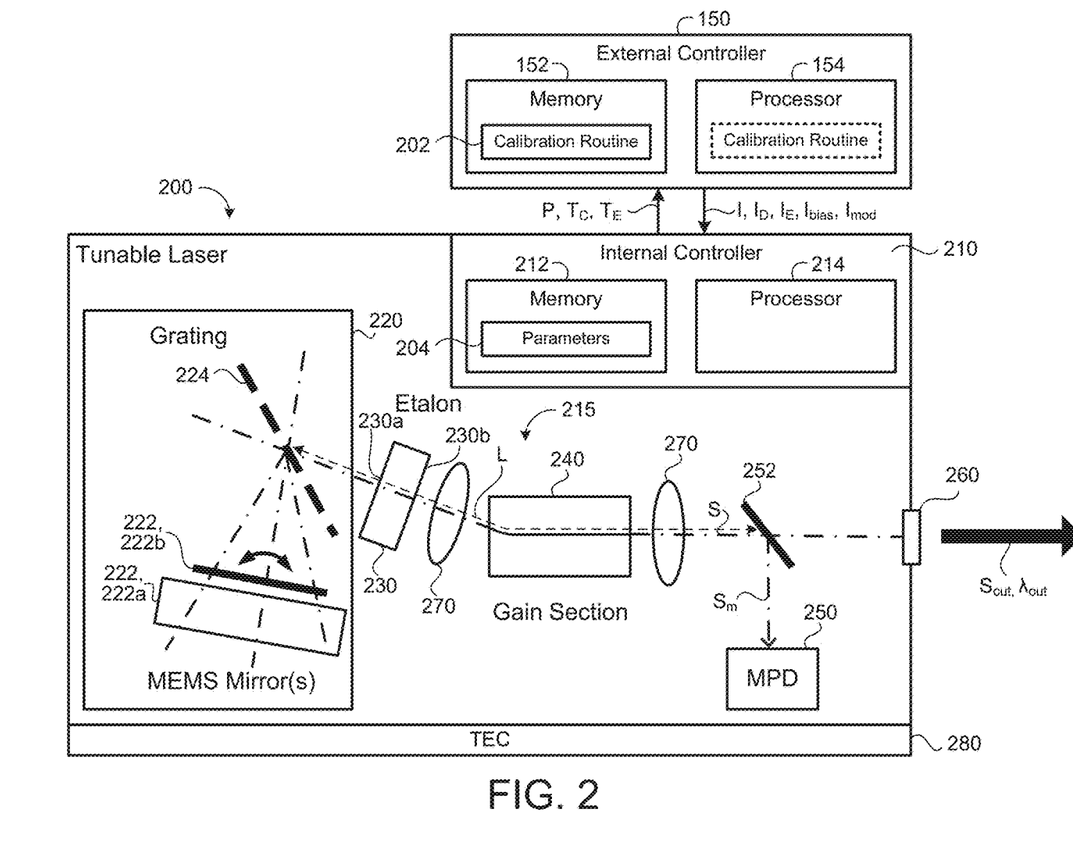
FIG. 2 is a schematic view of an exemplary wavelength tunable laser.

A tunable laser 200 can be used to transmit information on an optical fiber link using different wavelengths or optical frequencies. FIG. 2 illustrates an exemplary semiconductor tunable laser 200 based on an external cavity structure. The tunable laser 200 is a high-frequency oscillator, which requires amplification, feedback, and a tuning mechanism that determines the output frequency. Lasers emit light coherently such that the laser output is a narrow beam of light. The most basic laser includes a gain medium that provides the amplification and mirrors that provide the feedback. Photons bounce off one mirror through the medium and head back to another mirror to bounce back for further amplification. One, and sometimes both mirrors, may partially transmit light to allow a fraction of the generated light to be emitted. A laser diode is an electrically pumped semiconductor laser having an active medium being a p-n junction. The p-n junction is created by doping (i.e., introduction of impurities into a pure semiconductor to change its electrical properties). The gain medium usually provides gain over a broad frequency spectrum and a basic laser may emit multiple output frequencies without a frequency selection mechanism. A tunable laser 200 emits lights at specific frequencies, which can be tuned with a frequency selection mechanism.

In general, tunable lasers 200 tend to be more expensive than non-tunable lasers because tunable lasers require time and effort to calibrate, measure, and test at different wavelengths during the manufacturing process. For example, a tunable laser 200 having 32-channels has to be calibrated at each one of the 32 channels, i.e., calibration occurs 32 times. Thus, it is desirable to have a tunable laser calibration system 100b that reduces the effort and time to calibrate, measure, and test the different output wavelengths, which ultimately results in a reduction of cost of the tunable laser 200 by reducing the manufacturing time and labor. Generally, to perform calibration of a direct on-off keying modulated tunable laser used in a telecommunication system, three devices are needed: an optical wavelength meter 110 (for measuring the output wavelengths of the tunable laser); an optical spectrum analyzer (OSA) 120 (for measuring the output optical spectrum); and a digital sampling scope 130 (for measuring an extinction ratio of the tunable laser when the laser is modulated) are used. The digital sample scope 130 is used in conjunction with a pattern generator 132 which modulates the laser 200. These devices 110, 120, 130 are generally expensive and, in some examples, may be simplified in calibrating the tunable laser 200. Therefore, it is desirable to have a tunable laser calibration system 100b that includes a tunable laser 200 capable of self-calibration and eliminates the use of the optical spectrum analyzer 120 and the digital sampling scope 130 during most of the calibration process. Reducing the use of the optical spectrum analyzer 120 and the digital sampling scope 130 can improve the throughput of calibration process in a production line with the same number of optical spectrum analyzer and digital sampling scope setups and thus reduce the manufacturing cost. The tunable laser calibration system 100b eliminates the use of an optical spectrum analyzer 120 and a sampling scope 130, and uses an internal power monitor 250 (FIG. 2) within the tunable laser 200 to perform the calibration that is usually performed by the two eliminated devices. Moreover, the tunable laser calibration system 100b reduces the length of time the wavelength meter 110 is used to calibrate the wavelength reference (e.g. etalon 230 (FIG. 2)). The tunable laser calibration system 100b has a relatively lower cost by eliminating the use of expensive calibration equipment, i.e., the optical spectrum analyzer 120 and the sampling scope 130.

With continued reference to FIG. 2, in some implementations, the tunable laser 200 includes an internal controller 210, a tunable optical feedback filter 220, an etalon 230, a gain section 240, and a power monitor 250 (e.g., a photodiode). The internal controller 210 includes non-transitory memory 212 and one or more data processing devices 214 in communication with the memory 212. As shown, the tunable laser 200 is a hybrid external cavity tunable laser based on MEMS (micro-electro-mechanical system) mirror tuning. The tunable laser 200 includes one or more optical lenses 270 arranged to focus the optical signal travelling between the components of the tunable laser 200.

The tunable optical feedback filter 220 includes a tunable mirror 222 in optical connection with a grating 224. The tunable mirror 222 may be a micro-electro-mechanical system (MEMS) mirror. The MEMS mirror 222 includes a carrier 222a and a mirror 222b disposed on the carrier 222a. Tuning the MEMS mirror 222 by mechanically changing its angle modifies the feedback wavelength in the laser cavity of the tunable laser 200.

The grating 224 of the tunable optical feedback filter 220 is a diffraction grating. The diffraction grating 224 diffracts light into several beams travelling in different directions. Light with the desired frequency is diffracted by grating 224 and travels back along the etalon 230 and coupling lens 270 into the gain section 240 as feedback signal. The grating section 224 contains a periodic structure, which causes spatially varying optical amplitude and/or phase changes.

Figures 3A, 3B:
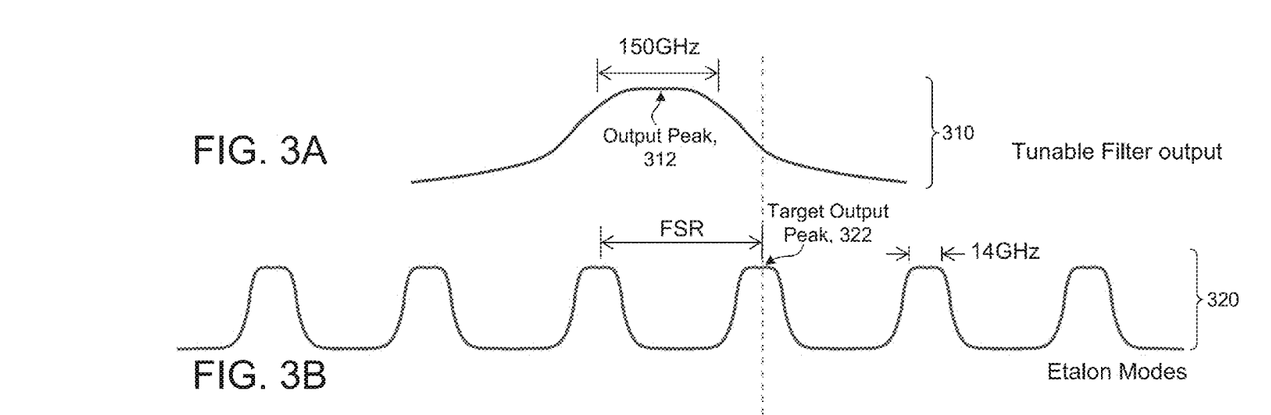
FIG. 3A is a schematic view of an initial state of a tunable filter mode.
FIG. 3B is a schematic view of an initial state of etalon modes.

The etalon 230 is optically connected in series with the tunable optical feedback filter 220, and the gain section 240 is optically connected in series with the etalon 230 through the coupling lens 270. An etalon 230 is an optical interferometer in which a beam of light undergoes multiple reflections between two reflecting surfaces (a first surface 230a and a second surface 230b), and whose resulting optical transmission or reflections are periodic in wavelength. An etalon 230, also known as a Fabry-Perot interferometer, is a narrow band wavelength filter. The etalon 230 is made of a transparent plate with two reflecting surfaces, or two reflecting mirrors 230a, 230b. The etalon's transmission spectrum as a function of wavelength exhibits peaks of large transmission corresponding to resonances of the etalon 230. An etalon 230, as used in the tunable laser 200, suppresses all cavity modes, except the ones matching the etalon resonant modes. Therefore, the etalon 230 is used to produce a reference wavelength for the output wavelength. The etalon 230 acts as a wavelength comb filter with precisely spaced (such as 50 GHz or 100 GHz) comb output peaks defined by the etalon free spectral range (FSR) (FIG. 3B). The FSR is the spacing in optical frequency or wavelength between two consecutive reflected or transmitted optical intensity maxima or minima of an interferometer of diffractive optical element.

The gain section 240 generates and modulates an optical signal S. In order to generate and modulate an optical signal S, the gain section 240 may be in a non-thermal energy distribution state known as a population inversion state. Population inversion occurs when a greater number of atoms or molecules within a system are in an excited state than in lower energy states. The preparation of the population inversion state entails applying an external energy source, known as laser pumping, to the system. Laser pumping occurs when an external source of energy is transferred to the gain section 240 of a tunable laser 200. The gain section 240 absorbs the energy, resulting in an excited state of the molecules of the gain section 240 to achieve the population inversion state. The pump energy is usually in the form of light or an electric current applied to the gain section 240. Other examples of pump energy may be used, such as chemical or nuclear reactions. In a semiconductor laser, electrical pumping is used.

The tunable laser 200 includes a signal splitter 252 between the gain section 240 and an output port 260. The signal splitter 252 is arranged to split the optical signal S traveling to the output port 260. The signal splitter 252 directs a portion of the split signal $S_m$ to the power monitor 250 and outputs the rest of the signal $S_{out}$ through the output port 260.

The power monitor 250 (e.g., a photodiode) measures the intensity or power of the light signal $S_m$ incident on the photodiode 250, which is a replica of the output signal $S_{out}$ with intensity in proportion to the optical signal intensity of $S_{out}$.

The tunable laser 200 is mounted on a thermo-electric cooler (TEC) 280 and receives a driving current $I_D$ (e.g., from the controller 210). The TEC 280 temperature may be a predetermined temperature to determine the temperature of the tunable laser 200. The controller 210 controls the driving current $I_D$, which determines the temperature of the TEC 280 and of the operating temperature of the tunable laser 200.

The external controller 150 sends commands to the internal controller 210 of the tunable laser 200 (e.g., through the digital control interface) and controls external calibration devices, such as the optical spectrum analyzer 120, to calibrate the tunable laser 200. Moreover, the external controller 150 receives output power signals P from the power monitor 250 of the tunable laser 200 for use during calibration of the tunable laser 200. The external controller 150 may store a calibration routine 202 in its memory 152 for execution by its one or more data processing devices 154. After the external controller 150 executes the calibration routine 202 and determines all the calibration/bias parameters 204, the external controller 150 may issue commands to save the parameters 204 in the memory 212 of the internal controller 210 of the tunable laser 200, so that when the laser is tuned for operation, the internal controller 210 can load the pre-calibrated parameters 204 to operate the laser 200 in a desired mode. The calibration routine 202 includes calibrating the output wavelength $\lambda_{out}$ of the tunable laser 200 (FIGS. 3A-6) and calibrating a grating bias current $I_{grating}$ to the grating section 224, a laser bias current $I_{bias}$ delivered to the gain section 240, and a modulation current $I_{mod}$ delivered to the gain section 240.

Figure 3C:
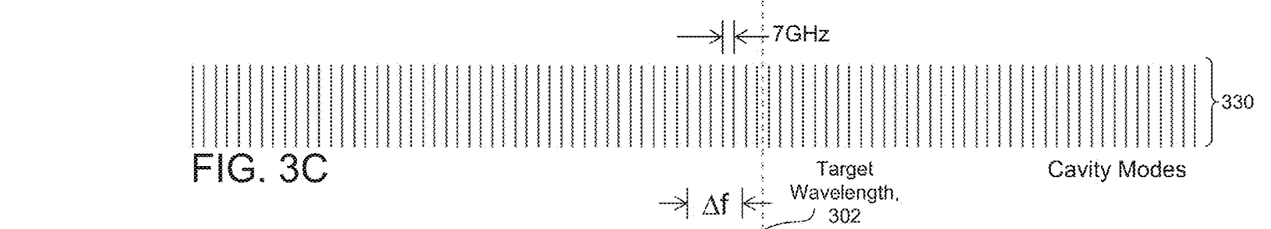
FIG. 3C is a schematic view of an initial state of cavity modes of the tunable laser.

FIGS. 3A-3D illustrate exemplary initial states of a filter mode 310, etalon modes 320, and laser cavity modes 330 with reference to a desired output frequency or wavelength grid 300. FIGS. 3A-3C show the initial states of the various components of the tunable laser 200. FIGS. 3A-3D share the same horizontal axis representing optical frequencies. The alignment of frequency peaks in FIGS. 3A-3C are random with respect to one another and also random with respect FIG. 3D.

Figure 3D:
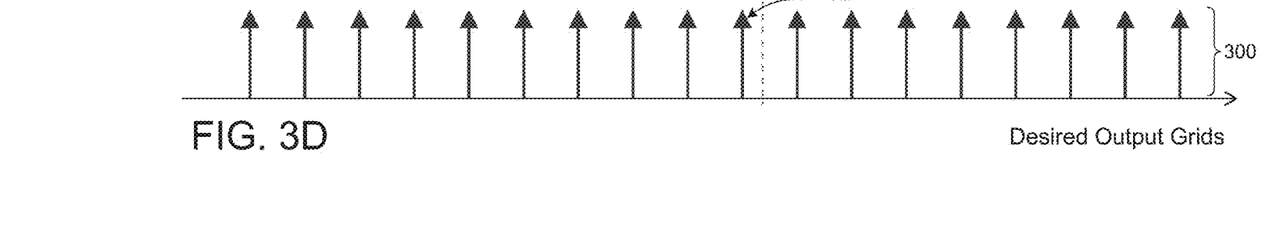
FIG. 3D is a schematic view of the desired output modes, which is an absolute frequency grid for the tunable laser output frequencies to be aligned with. An example of the desired output modes are the frequencies defined in ITU G.694.1 Standard.

The light within a resonator cavity 215 (e.g., etalon or laser cavity) of the tunable laser 200 reflects multiple times producing a standing wave for certain resonance frequencies. These standing wave patterns are called modes. In general, radiation patterns produced on every round-trip of the light through the resonator cavity 215 are the most stable, and these form the modes of the resonator cavity of the tunable laser 200. FIG. 3A shows the tunable optical feedback filter 220 signal frequency output as a single filter mode 310. In some examples, the bandwidth of the tunable optical feedback filter equals 150 GHz, but other bandwidth values are possible as well. FIG. 3B shows exemplary etalon modes 320 of the etalon 230. In some examples, an etalon mode 320 of the etalon 230 has bandwidths equaling 14 GHz, but other values are possible as well. FIG. 3C shows exemplary cavity modes 330 having about 7 GHz spacing. Finally. FIG. 3D shows a desired output grid 300. The bandwidth of the tunable filter 220 (FIG. 3A) is generally much wider than that of the etalon bandwidth (FIG. 3B), and the laser cavity modes 330 (FIG. 3C) are generally much denser than that of the etalon modes 320 (FIG. 3B) in the spectral domain. A wavelength meter (not shown) can be used to monitor the output wavelength $\lambda_{out}$ of the tunable laser 200 while applying a bias current $I_{grating}$ to the tunable filter 220 (e.g. grating section 224) to fine tune and find a local maximum of the output power of the tunable laser 200.

Figure 4A:
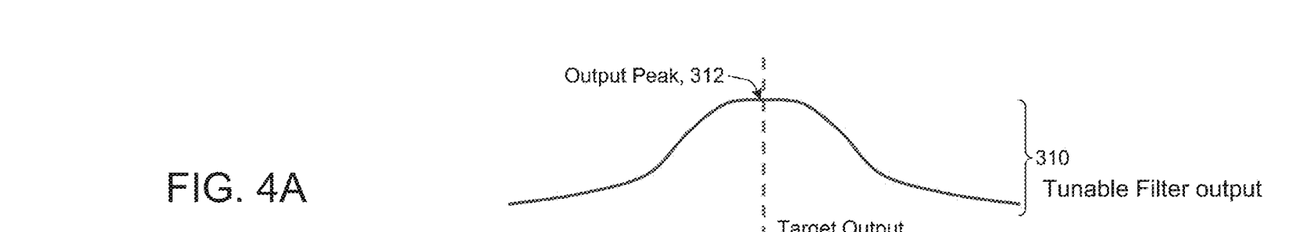
FIG. 4A is a schematic view of a calibration state of a tunable filter mode of FIG. 3A, showing the tunable filter output peak aligned to the etalon modes.
Figure 4B:
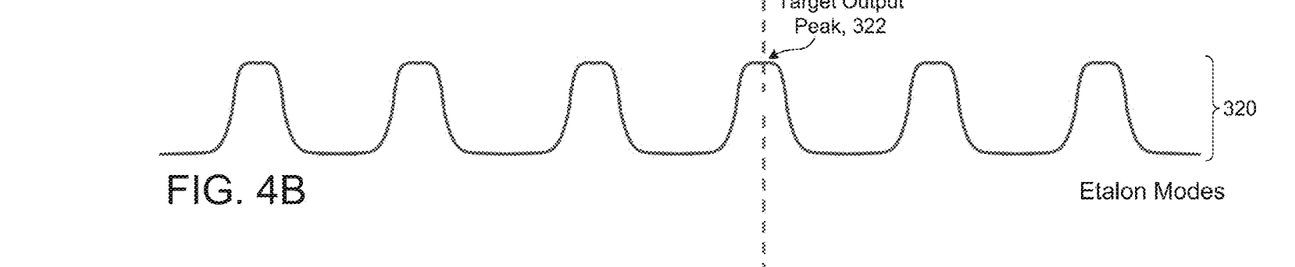
Figure 4C:
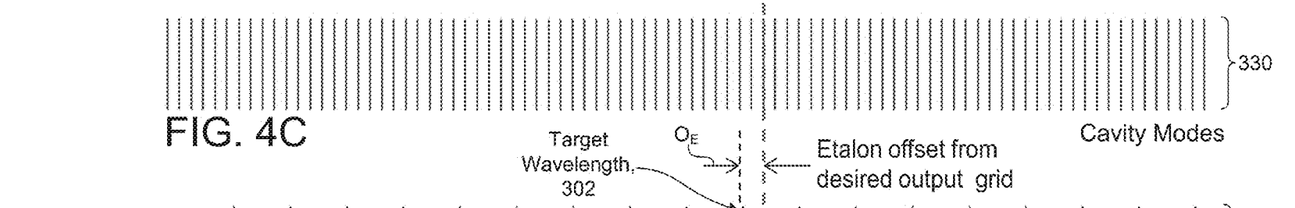
FIG. 4C is a schematic view of a calibration state of the cavity modes of FIG. 3C. One of the cavity modes is aligned with an etalon mode and the tunable filter mode, as indicated by the vertical dash line.

The calibration routine 202 includes shifting a filter output peak 312 (FIG. 3A) defined by the tunable optical feedback filter 220 of the tunable laser 200 in an optical spectral domain to align with a target etalon output peak 322 (FIG. 3B) of a plurality of spaced etalon output peaks 320 defined by an etalon 230 of the tunable laser 200. FIG. 4A shows the aligned filter output peak 312 of the tunable optical feedback filter 220 with the target etalon output peak 322 (FIG. 3B and FIG. 4B). In some examples, the calibration routine 202 biases the tunable optical feedback filter 220 with an electric current $I_{grating}$ to shift the filter output peak 312 (FIG. 3A and FIG. 4A) defined by the tunable optical feedback filter 220 to align the filter output peak 312 with the target etalon output peak 322 (FIG. 3B and FIG. 4B). Then the calibration routine 202 shifts the cavity frequency grid 330 (FIG. 3C) defined by cavity modes 330 of the tunable laser 200 to align a target cavity mode 332 (FIG. 5C) of the cavity frequency grid 330 with the aligned filter output peak 312 (FIG. 4A). The cavity modes 330 are defined by a total optical path length L inside a resonant cavity 215 of the tunable laser 200.

Figure 4D:
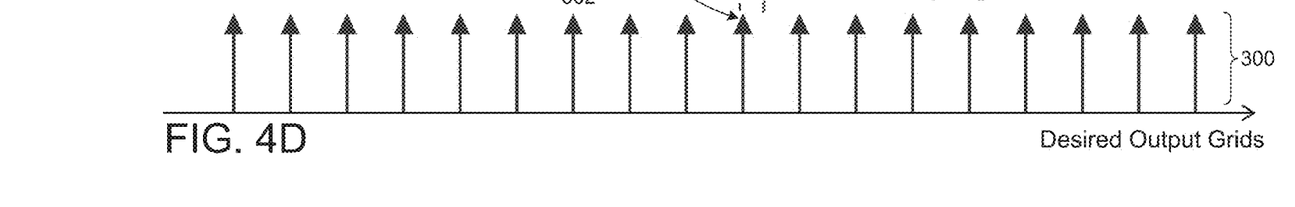
FIG. 4D is a schematic view a calibration state of a desired output mode of FIG. 3D.
Figure 5A:
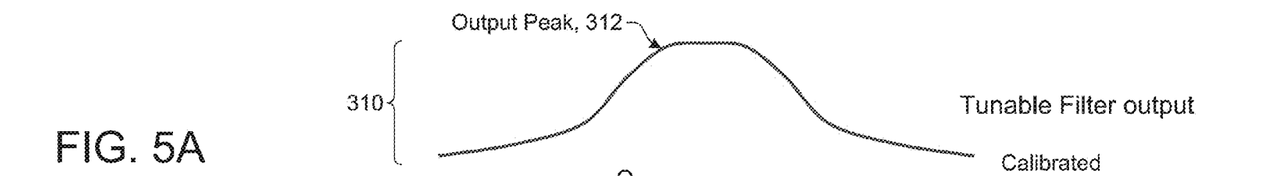
FIG. 5A is a schematic view of a calibration state of a tunable filter mode of FIG. 3A.
Figure 5B:
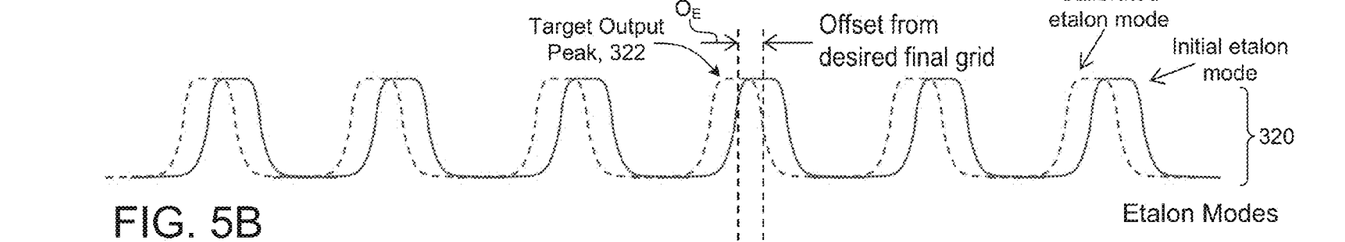
FIG. 5B is a schematic view showing the offset of initial etalon modes in FIG. 3B (solid curve) from the desired output grid modes (dashed curve), which is represented by the difference between the two vertical dash lines.
Figure 5C:
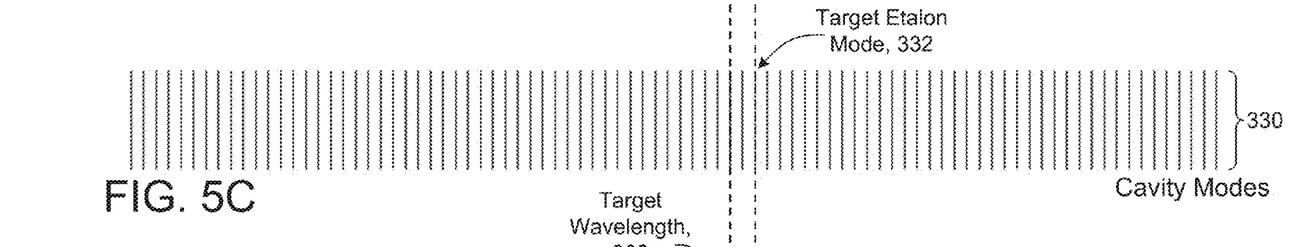
FIG. 5C is a schematic view of a calibration state of a cavity modes of FIG. 3C.
Figure 5D:
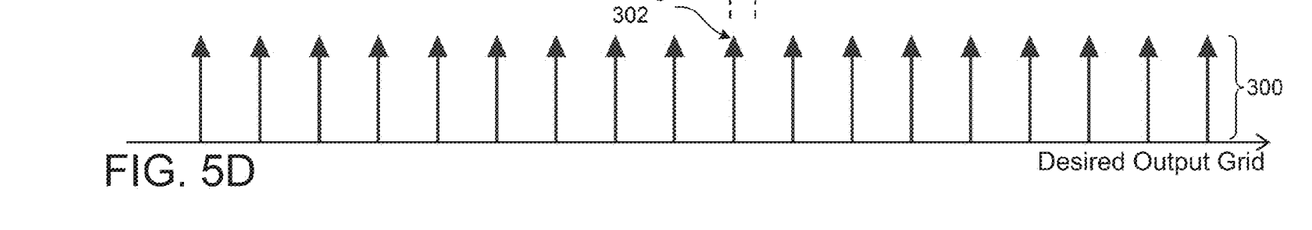
FIG. 5D is a schematic view a calibration state of a desired output mode of FIG. 3D and FIG. 4D.

After shifting the cavity frequency grid 330 (FIG. 4C) to be aligned with the aligned filter output peak 312 (FIG. 4A), the calibration routine 202 shifts the spaced output peaks 320 defined by the etalon 230 to align a target etalon output peak 322 (FIG. 5B) with the target wavelength 302 of the output frequency grid 300 (FIG. 5D). The calibration routine 202 determines an offset $O_E$ between the target etalon output peak 322 (FIG. 4B) and the target wavelength 302 of the output frequency grid 300 (FIG. 4D). At this state, FIG. 4B is identical to FIG. 3B. The etalon modes are still not aligned to the desired output modes in FIG. 4D. The comb output 320 of the etalon 230 is shifted in the optical spectral domain to align with a desired output frequency grid 300 (FIG. 5D), such as an ITU (International Telecommunication Union) grid to form the reference frequency grid for the tunable laser 200. ITU is a specialized agency of the United Nations responsible for issues concerning information and communication technologies. ITU is responsible for making standards regarding communications.

Figure 6:
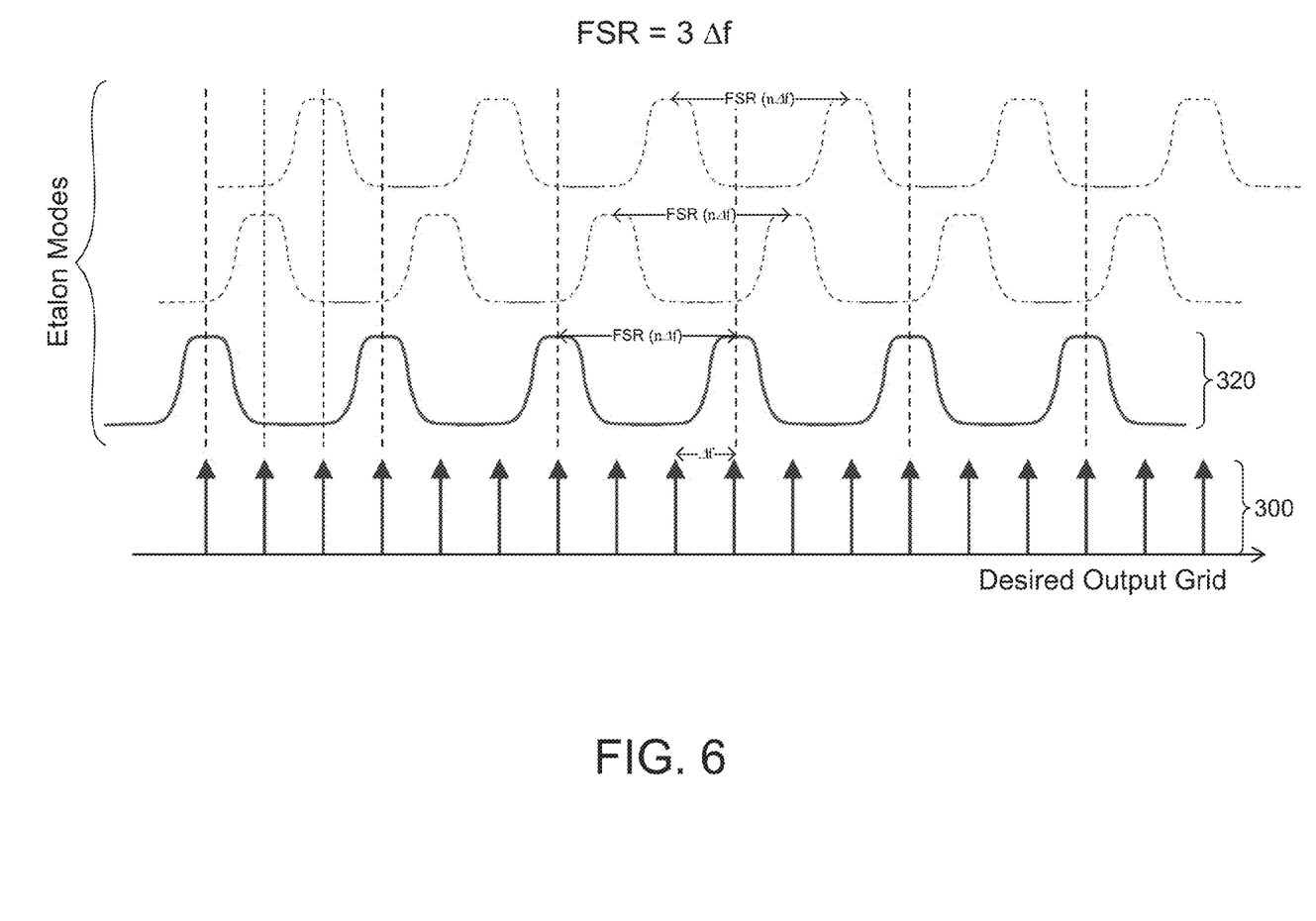
FIG. 6 is schematic view of operation modes of an etalon with a FSR equaling three times an output frequency grid separation.

Aligning the etalon peaks 320, 322 with the desired output frequency grid 300 (FIGS. 3D, 4D, 5D) is the first step in tuning the output wavelength $\lambda_{out}$. Referring to FIG. 6, in some examples, the FSR (spacing in optical frequency or wavelength between two consecutive reflected or transmitted optical intensity maxima or minima of an interferometer of diffractive optical element) of the etalon 230 is n·Δf, where Δf is the tunable laser output frequency separation, which is also the separation between adjacent frequencies on the desired grid. For example, a tunable laser 200 may have an output on a 100 GHz frequency grid, while the etalon 230 has a 300 GHz grid (n=3) FSR. Thus, the etalon 230 forms part of a filtering chain in the external cavity of the tunable laser 200. As shown in the FIGS. 3-5, the etalon 230 helps to suppress the output from adjacent laser mode, improves side mode suppression ratio (SMSR), and helps to prevent mode hopping. SMSR is the relation of power between center peak longitudinal mode and the nearest higher order. However, an etalon 230 with n>1 is shifted to align with a desired output mode when the tunable laser 200 is tuned to the n−1 frequencies in between two etalon modes. For instance, if the laser has output frequencies $f_1$, $f_2$, $f_3$, $f_4$, . . . , where $f_{i+1}-f_i=\Delta f$, Δf is the output grid spacing, and the etalon FSR is 3Δf (e.g., $3f_{grid}$), then for laser output frequencies $f_1$, $f_4$, $f_7$, etc., the etalon 230 is aligned to output grid frequencies $f_1$, $f_4$, $f_7$. However, if the tunable laser 200 needs to tune to frequencies $f_2$, $f_5$, $f_8$, etc., then the etalon grid needs to shift by Δf. Tuning the etalon 230 may be performed by adjusting the temperature of the etalon 230.

In some examples, the calibration routine 202 alters a temperature of the etalon 230 to align the etalon wavelength grid 320 (FIG. 3B) corresponding to the etalon 230 with the output wavelength grid 300 (FIG. 3D) using the determined offset $O_E$ and a temperature coefficient of the etalon 230. The etalon output wavelengths 320 (FIGS. 3B, 4B, 5B) are aligned to the output frequency grid (FIG. 3D, 4D, 5D) using the known temperature coefficient of the etalon 230. The etalon 230 is a wavelength reference with very accurate periodic wavelength spacing exactly matching the output wavelength grid spacing. In addition, the etalon 230 has a very linear temperature coefficient. So given a current temperature $T_E$ of the etalon 230 and the knowledge of the offset $O_E$ between the current etalon wavelength grid 320 (e.g., as determined through the alignment procedure) and the output wavelength grid 300, the external controller 150 may determine etalon temperature changes to align the etalon mode grid 320 (FIG. 3B) to the desired output wavelength grid 300. In some implementations, the one or more data processing devices 206, which execute the calibration routine 202, alter the temperature of the etalon 230 by causing delivery of a bias current $I_E$ to the etalon 230 (FIG. 2).

Once the etalon wavelength grid 320 (FIG. 4B) and the output wavelength grid 300 (FIG. 4D) are aligned as shown in FIGS. 5B and 5D, the calibration routine 202 stores the determined offset $O_E$ and a current temperature $T_E$ of the etalon 230 in the non-transitory memory 152, 212 (e.g., of the external controller 150 and/or the internal controller 210). The TEC 280 may measure the temperature $T_F$ of the etalon 230 or separate dedicated temperature sensor (not shown) in communication with the external controller 150 may measure the temperature $T_E$ of the etalon 230

To fine tune the tunable laser 200, the calibration routine 202 monitors an optical output signal $S_{out}$ of the tunable laser 200, based on signals received by the external controller 150 from the power monitor 250, while biasing the tunable optical feedback filter 220 to identify a local maximum of output power P of the tunable laser 200. The calibration routine 202 alters a temperature $T_C$ of the resonant cavity 215 of the tunable laser 200 by a temperature increment (e.g., 0.2 degrees Celsius) to shift the cavity frequency grid 330 (FIG. 3C, 4C, 5C) by electrically biasing the TEC 280. In some examples, the calibration routine 202 includes determining alignment of the filter output peak 312 (FIG. 3A), the target etalon output peak 322 (FIG. 3B), and the target cavity mode 332 (FIG. 3C) as occurring when the tunable laser 200 outputs its local maximum output power $P_1$. When the filter output peak 312, the target etalon output peak 322, and the target cavity mode 332 are aligned, the calibration routine 202 includes storing in the non-transitory memory 152, 212 (e.g., of the external controller 150 and/or the internal controller 210) one or more of a bias current $I_{grating}$ amount of the tunable optical feedback filter 220, a cavity temperature $T_C$ of the resonant cavity 215, and a temperature $T_E$ of the etalon 230.

At the end of the first step, which is the end of the power maximization process, the etalon modes 320, tunable filter output wavelength and laser cavity modes 310, 330 are all aligned to an etalon output mode 322. The external controller 150 may measure the wavelength of the etalon output mode 322 (e.g., using an optical wavelength meter) and store the measured wavelength in the non-transitory memory 152, 212 (e.g., of the external controller 150 and/or the internal controller 210). The power monitor 250 (e.g., a photodiode within the tunable laser 200) monitors the power output of the tunable laser 200 and the external controller 150 may store the power output associated with the different wavelengths of the etalon 230 in the non-transitory memory 152, 212 (e.g., of the external controller 150 and/or the internal controller 210).

The tunable laser calibration system 100b reduces the time and effort to calibrate each channel (wavelength of the output grid 300) of the tunable laser 200 by eliminating the use of a digital sampling scope, which measures the extinction ratio (ER) of the tunable laser 200. The extinction ratio (ER) is a ratio used to describe the performance of an optical transmitter for digital communications. The ER is the ratio of the energy (power) used to transmit a logic level '1', to the energy used to transmit a logic level '0'. Therefore, if the '1' power level was 1000 microwatts and the '0' power level was 50 microwatts, the ER would be 20. The tunable laser calibration system 100b uses the power meter 250 (e.g., photodiode) to monitor the optical power output of the tunable laser 200 as the external controller 150 sweeps a bias current I delivered to the gain section 240 of the tunable laser 200 between a minimum modulation current $I_{m\_min}$ and a maximum modulation current $I_{m\_max}$. During the calibration process, the wave meter is only used to align the setting for the etalon 230 and finding out the setting of the first known output wavelength. The rest of the calibration process relies on the built-in power monitor 250, whereas in a conventional setting, the wave meter is needed during the whole wavelength calibration process. The external controller 150 sweeps the tunable filter bias $I_{grating}$ through the tuning range and the settings for all of the desired output wavelengths of the output grid 300 are calibrated and stored in the memory 152, 212 (e.g., of the external controller 150 and/or the internal controller 210). For designs which employ etalons 230 with FSRs that are multiples (n times) of the output wavelength grid separation Δf, as described earlier, there may be n different settings of the etalon temperatures $T_E$. Therefore, the calibration routine 202 aligns the etalon modes 320 of the etalon 230 to sub-grids of the output wavelength/frequency grid 300 and the process is repeated with all sub-grids. Therefore, the non-transitory memory 152, 212 (e.g., of the external controller 150 and/or the internal controller 210) stores the information pertaining to each sub-grid of the output wavelength (e.g., output wavelength, modulation current $I_{mod}$, bias current $I_{bias}$, cavity temperature $T_C$, etalon temperature $T_E$, grid separation Δf, and/or offset $O_E$, etc.).

Therefore, the second step of the calibration routine 202 includes calibrating the output wavelengths $\lambda_{out}$ of the tunable laser system 100b includes aligning the filter output peak 312 of the tunable optical feedback filter 220, the target etalon output peak 322 of the etalon 230 and the target cavity mode 332 of the cavity frequency grid 330, and the output reference grid 300 all with the desired output wavelength $\lambda_{out}$ (which is one of the peaks 302 in the desired frequency grid 300). The second step of the calibration routine 202 includes calibrating the biased current $I_{bias}$ and the modulation current $I_{mod}$ to provide a desired extinction ratio ER of the tunable laser 200. The biased current $I_{bias}$ and the modulation current $I_{mod}$ directly affect the average output power, the output modulation amplitude (OMA) and extinction ratio (ER) of the tunable laser system 100b.

Figure 7:
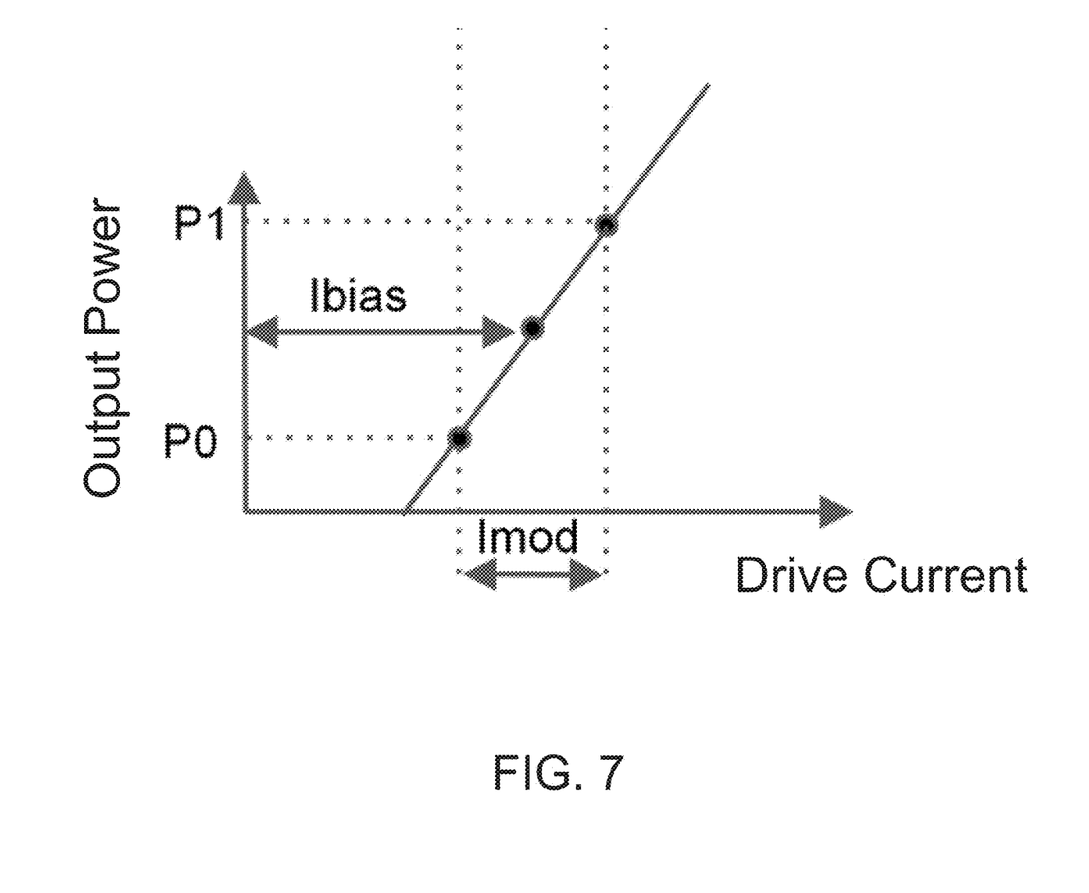
FIG. 7 is schematic view of an exemplary L-I curve for a tunable laser.

Referring to FIG. 7, the tunable laser 200 output power (P) depending on the gain section drive current (I) shown in the L-I curve, measurements of the output power P vs. current I in the linear region gives a slope efficiency of the laser S, where S=ΔP/ΔI. The controller 202 may determine the L-I curve by monitoring the laser output (e.g., at each wavelength) using the built-in power monitor 250 while sweeping the drive current I from a first threshold to a second threshold. The bias current $I_{bias}$ and modulation current $I_{mod}$ obtained are stored in the non-transitory memory 204 as the operation condition.

In some implementations, the external controller 150 monitors the optical power P of the optical output signal $S_{out}$ of the tunable laser 200 using the power monitor 250 (e.g., using a photodiode, such as one built into the laser 200) while electrically biasing the tunable laser 200 at a first power level $P_1$ (e.g., a high power level) and at a second power level $P_0$ (e.g., a low power level) lower than the first power level $P_1$. In some examples, the calibration routine 202 monitors an output power P of the optical output signal $S_{out}$ of the tunable laser 200 at each wavelength of the output wavelength grid 300 while varying a modulation current $I_{mod}$ delivered to a gain section 240 of the tunable laser 200 between a minimum modulation current $I_{m\_min}$ and a maximum modulation current $I_{m\_max}$. The calibration routine 202 determines a modulation current $I_{mod}$ of the gain section 240 of the tunable laser 200 based on a relationship between the output power $P_{out}$ of the tunable laser 200 and the modulation current $I_{mod}$ applied to the gain section 240.

The calibration routine 202 determines the bias current $I_{bias}$ and modulation current $I_{mod}$ using the following equation:

$$ER = \frac{P_1}{P_0} = \frac{I_{bias} + \frac{I_{mod}}{2} - I_{th}}{I_{bias} - \frac{I_{mod}}{2} - I_{th}} \quad (1)$$

where ER is the target extinction ratio, $P_1$ is the first power level, $P_0$ is the second power level, $I_{bias}$ is a bias current applied to the grating section 224, $I_{mod}$ is a modulation applied to the gain section 240, and $I_{th}$ is a threshold current (e.g., a minimum current).

The calibration routine 202 determines the modulation current $I_{mod}$ of the gain section 240 of the tunable laser using:

$$I_{mod} = OMA/S \quad (2)$$

where $I_{mod}$ is the modulation current, OMA is an optical modulation amplitude, and S is a slope efficiency (S=ΔP/ΔI).

The calibration routine 202 determines the bias current $I_{bias}$ of the gain section 240 of the tunable laser 200 using:

$$I_{bias} = \frac{I_{mod}}{ER - 1} + \frac{I_{mod}}{2} + I_{th} \quad (3)$$

wherein $I_{bias}$ is the bias current, $I_{mod}$ is the modulation current applied to the gain section 240, ER is a desired extinction ratio of the laser, and $I_{th}$ is a threshold current.

Based on the above calculation of the bias current $I_{bias}$ and modulation current $I_{mod}$, the calibration routine 202 sets the bias current $I_{bias}$ for the gain section 240 and the modulation current $I_{Mod}$ for the gain section 240 of the tunable laser 200 to set the target output power P and the target extinction ratio ER of the tunable laser 200.

In general, tunable lasers tend to experience a current drift as the laser ages. The tunable laser calibration system 100b is self-calibrating and the calibration routine 202 may be routinely executed to correct for any laser bias current drifts as the laser ages. Therefore, tunable laser calibration system 100b provides improved performance over time for tunable lasers 200.

Figure 8:
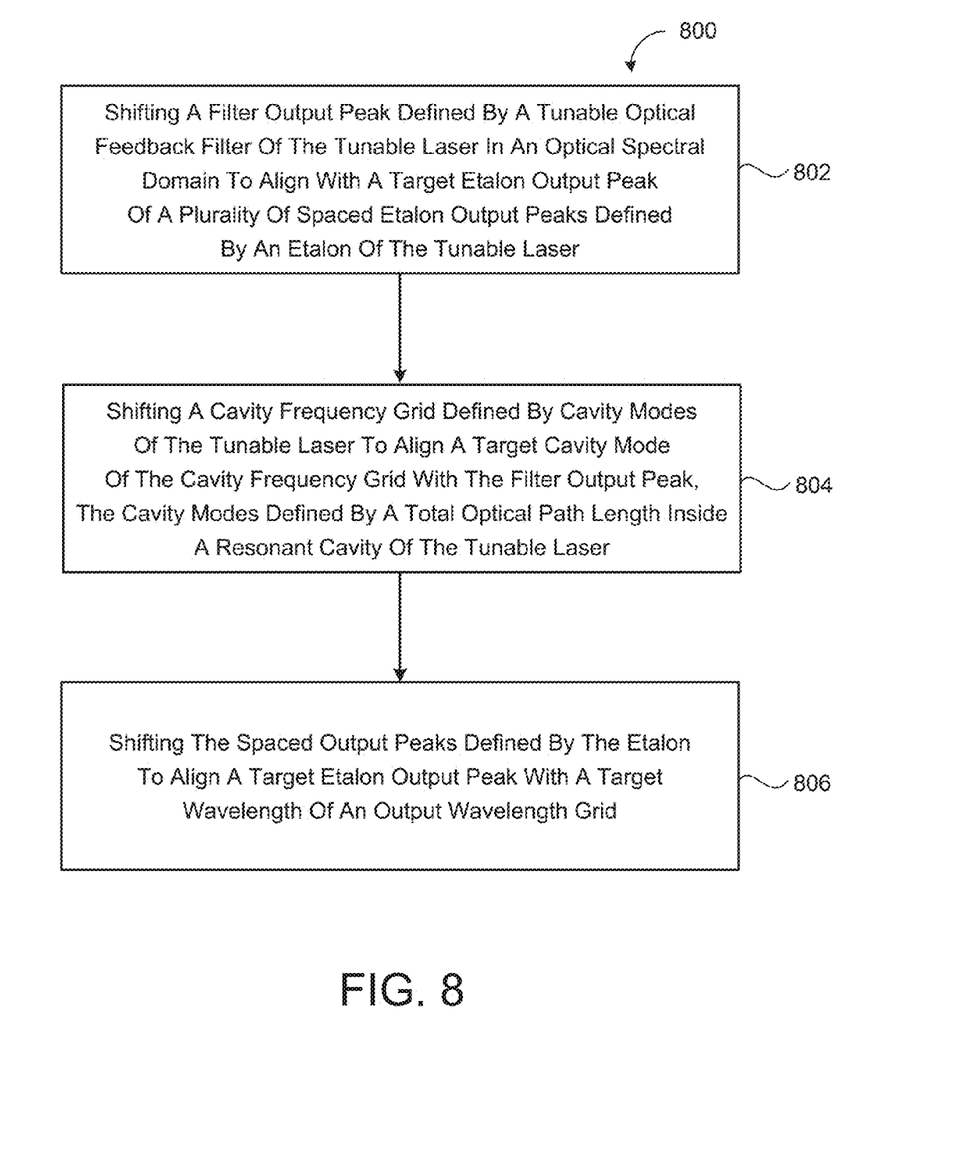
FIG. 8 is a schematic view of an exemplary arrangement of operations for using a wavelength tunable laser.

Referring to FIG. 8, in some implementations, a method 800 of calibrating a tunable laser 200 includes shifting 802 a filter output peak 312 defined by a tunable optical feedback filter 220 of a tunable laser 200 (included in the tunable laser system 100b) in an optical spectral domain to align with a target etalon output peak 322 of a plurality of spaced etalon output peaks (an etalon frequency grid 320) defined by an etalon 230 of the tunable laser 200. The method 800 also includes shifting 804 a cavity frequency grid 330 defined by cavity modes of the tunable laser 200 to align a target cavity mode 332 of the cavity frequency grid 330 with the aligned filter output peak 312. The method 800 also includes shifting 806 the spaced output peaks (i.e., the etalon frequency grid) 320 defined by the etalon 230 to align a target etalon output peak 322 with a target wavelength 302 of an output wavelength grid 300.

In some implementations, the method 800 includes determining an offset $O_E$ between the target etalon output peak 322 and the target wavelength 302 of the output wavelength grid 300. The method 800 may include altering a temperature $T_E$ of the etalon 230 to align the etalon wavelength grid 320 corresponding to the etalon 230 with the output wavelength grid 300 using the determined offset $O_E$ and a temperature coefficient of the etalon 230. When the etalon grid 320 and the output wavelength grid 300 are aligned, the method 800 includes storing the determined offset $O_E$ and the current temperature $T_E$ of the etalon 230 in non-transitory memory 152, 212 (e.g., of the external controller 150 and/or the internal controller 210). In some examples, the method 800 includes altering the temperature $T_E$ of the etalon 230 to align the target etalon output peak 322 with the target wavelength 302 of the output wavelength grid 300.

In some implementations, the method 800 includes biasing the tunable optical feedback filter 220 with an electric current $I_{grating}$ (applied to the grating section 224) to shift the output peak 312 defined by the tunable optical feedback filter 220 to align the filter output peak 312 with the target etalon output peak 322. In some examples, the method 800 includes monitoring the optical output signal $S_{out}$ of the tunable laser 200 using a photodiode 250 of the laser 200 while biasing the tunable optical feedback filter 220 to identify a local maximum of output power P of the tunable laser 200. The method 800 may include altering a temperature $T_C$ of the resonant cavity 215 of the tunable laser 200 by a temperature increment (e.g., in 0.2 degrees Celsius steps) to shift the cavity frequency grid 330. In some examples, the method 800 further includes determining alignment of the filter output peak 312, the target etalon output peak 322, and the target cavity mode 332 as occurring when the tunable laser 200 outputs its local maximum output power P. When the filter output peak 312, the target etalon output peak 322, and the target cavity mode 332 are aligned, the method 800 may further include storing in non-transitory memory 152, 212 (e.g., of the external controller 150 and/or the internal controller 210) one or more of a bias current $I_{grating}$ of the tunable optical feedback filter 220, a cavity temperature $T_C$ of the resonant cavity 215, and a temperature $T_E$ of the etalon 230.

In some implementations, the method 800 further includes monitoring an output power P of the optical output signal $S_{out}$ of the tunable laser 200 at each wavelength of the output wavelength grid 300 while varying a modulation current $I_{mod}$ between a minimum modulation current $I_{m\_min}$ and a maximum modulation current $I_{m\_max}$ delivered to the gain section 240 of the tunable laser 200. In some examples, the method 800 includes determining the modulation current $I_{mod}$ of the gain section 240 of the tunable laser 200 based on a relationship between the output power P of the tunable laser 200 and the bias current $I_{bias}$ applied to the gain section 240.

Various implementations of the systems and techniques described here can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Implementations of the subject matter and the functional operations described in this specification can be implemented in digital electronic circuitry, or in computer software, firmware, or hardware, including the structures disclosed in this specification and their structural equivalents, or in combinations of one or more of them. Moreover, subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The terms "data processing apparatus", "computing device" and "computing processor" encompass all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as an application, program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multi-tasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:

1. A method of calibrating a tunable laser, the method comprising:
   shifting a filter output peak defined by a tunable optical feedback filter of the tunable laser in an optical spectral domain to align with a target etalon output peak of a plurality of spaced etalon output peaks defined by an etalon of the tunable laser,
   shifting a cavity frequency grid defined by cavity modes of the tunable laser to align a target cavity mode of the cavity frequency grid with the filter output peak, the cavity modes defined by a total optical path length inside a resonant cavity of the tunable laser;
   shifting the spaced etalon output peaks defined by the etalon to align the target etalon output peak with a target wavelength of an output wavelength grid; and
   modifying a bias current and a modulation current of a gain section of the tunable laser to achieve a defined output modulation amplitude and a defined extinction ratio.

2. The method of claim 1, further comprising aligning the filter output peak of the tunable optical feedback filter with an etalon output peak near the target wavelength of the output wavelength grid by monitoring an output wavelength of the tunable laser on an optical spectrum analyzer while maximizing the output power of the tunable laser by tuning a bias current to the tunable optical feedback filter.

3. The method of claim 2, further comprising using a built-in monitoring photo-diode of the tunable laser to monitor the output power of the tunable laser.

4. The method of claim 1, further comprising determining an offset between the target etalon output peak and the target wavelength of the output wavelength grid after the filter output peak, the target etalon peak, and the target cavity mode are aligned in the optical spectrum.

5. The method of claim 4, further comprising altering a temperature of the etalon to align an etalon wavelength grid corresponding to the etalon with the output wavelength grid using the determined offset and a temperature coefficient of the etalon.

6. The method of claim 4, further comprising, when the etalon wavelength grid and the output wavelength grid are aligned, storing the determined offset and a current temperature of the etalon in non-transitory memory.

7. The method of claim 1, further comprising altering a temperature of the etalon to align the target etalon output peak with the target wavelength of the output wavelength grid.

8. The method of claim 1, further comprising biasing the tunable optical feedback filter with an electric current to shift the filter output peak defined by the tunable optical feedback filter to align the filter output peak with the target etalon output peak.

9. The method of claim 8, further comprising monitoring an optical output of the tunable laser using a photodiode of the laser while biasing the tunable optical feedback filter to identify a local maximum of output power of the tunable laser.

10. The method of claim 9, further comprising altering a temperature of the resonant cavity of the tunable laser by a threshold temperature increment to shift the cavity frequency grid.

11. The method of claim 9, further comprising determining alignment of the filter output peak, the target etalon output peak, and the target cavity mode as occurring when the tunable laser outputs its local maximum output power.

12. The method of claim 11, further comprising, when the filter output peak, the target etalon output peak, and the target cavity mode are aligned, storing in non-transitory memory one or more of a bias current amount of the tunable optical feedback filter, a cavity temperature of the resonant cavity, and a temperature of the etalon.

13. The method of claim 1, wherein a free spectral range of the etalon is $n \times f_{grid}$, where $f_{grid}$ is a laser output frequency separation of the output wavelength grid and n is an integer multiplier.

14. The method of claim 1, further comprising monitoring an output power of an optical output of the tunable laser at each wavelength of the output wavelength grid while varying a modulation current between a minimum modulation current and a maximum modulation current delivered to a gain section of the tunable laser.

15. The method of claim 14, further comprising determining the modulation current of the gain section of the tunable laser based on a relationship between the output power of the tunable laser and the modulation current applied to the gain section.

16. The method of claim 15, wherein the calibration routine comprises determining the modulation current of the gain section of the tunable laser using:

$$I_{mod} = OMA/S$$

wherein $I_{mod}$ is the modulation current, OMA is an optical modulation amplitude, and S is a slope efficiency of the laser.

17. The method of claim 16, wherein the calibration routine comprises determining a bias current of the gain section of the tunable laser using:

$$I_{bias} = \frac{I_{mod}}{ER-1} + \frac{I_{mod}}{2} + I_{th}$$

wherein $I_{bias}$ is the bias current, $I_{mod}$ is the modulation current, ER is a desired extinction ratio of the laser, and $I_{th}$ is a threshold current.

18. A tunable laser system comprising:
a tunable optical feedback filter;
an etalon in series with the tunable optical feedback filter;
a gain section in series with the etalon; and
a power monitor in optical communication with the gain section; and
a controller in communication with the tunable optical feedback filter, the etalon, the gain section, and the power monitor, the controller comprising:
non-transitory memory; and
one or more data processing devices in communication with the non-transitory memory, the one or more data processing devices executing instructions configuring the one or more data processing devices to execute a calibration routine comprising:
shifting a filter output peak defined by the tunable optical feedback filter of the tunable laser in an optical spectral domain to align with a target etalon output peak of a plurality of spaced etalon output peaks defined by the etalon of the tunable laser;
shifting a cavity frequency grid defined by cavity modes of the tunable laser to align a target cavity mode of the cavity frequency grid with the filter output peak, the cavity modes defined by a total optical path length inside a resonant cavity of the tunable laser; and etalon
the shifting the spaced etalon output peaks defined by the etalon to align the target etalon output peak with a target wavelength of an output wavelength grid.

19. The tunable laser system of claim 18, wherein the tunable optical feedback filter comprises a tunable mirror in optical communication with a grating.

20. The tunable laser system of claim 18, wherein the power monitor comprises a photodiode.

21. The tunable laser system of claim 18, wherein the calibration routine comprises determining an offset between the target etalon output peak and the target wavelength of the output wavelength grid.

22. The tunable laser system of claim 21, wherein the calibration routine comprises altering a temperature of the etalon to align an etalon wavelength grid corresponding to the etalon with the output wavelength grid using the determined offset and a temperature coefficient of the etalon.

23. The tunable laser system of claim 22, wherein the one or more data processing devices executing the calibration routine alter the temperature of the etalon by causing delivery of a bias current to a temperature controller attached to the etalon.

24. The tunable laser system of claim 22, wherein the calibration routine comprises, when the etalon wavelength grid and the output wavelength grid are aligned, storing the determined offset and a current temperature of the etalon in the non-transitory memory.

25. The tunable laser system of claim 18, wherein the calibration routine comprises altering a temperature of the etalon to align the target etalon output peak with the target wavelength of the output wavelength grid, the one or more data processing devices executing the calibration routine alter the temperature of the etalon by causing delivery of a bias current to a temperature controller attached to the etalon.

26. The tunable laser system of claim 18, wherein the calibration routine comprises biasing the tunable optical feedback filter with an electric current to shift the filter output peak defined by the tunable optical feedback filter to align the filter output peak with the target etalon output peak.

27. The tunable laser system of claim 26, wherein the calibration routine comprises monitoring an optical output of the tunable laser, based on signals received by the controller from the power monitor, while biasing the tunable optical feedback filter to identify a local maximum of output power of the tunable laser.

28. The tunable laser system of claim 27, wherein the calibration routine comprises altering a temperature of the resonant cavity of the tunable laser by a threshold temperature increment to shift the cavity frequency grid.

29. The tunable laser system of claim 27, wherein the calibration routine comprises determining alignment of the filter output peak, the target etalon output peak, and the target cavity mode as occurring when the tunable laser outputs its local maximum output power.

30. The tunable laser system of claim 29, wherein the calibration routine comprises, when the filter output peak, the target etalon output peak, and the target cavity mode are aligned, storing in the non-transitory memory one or more of a bias current amount of the tunable optical feedback filter, a cavity temperature of the resonant cavity, and a temperature of the etalon.

31. The tunable laser system of claim 18, wherein the calibration routine comprises monitoring an output power of an optical output of the tunable laser, based on signals received by the controller from the power monitor, at each wavelength of the output wavelength grid while varying a modulation current between a minimum modulation current and a maximum modulation current delivered to the gain section of the tunable laser.

32. The tunable laser system of claim 31, wherein the calibration routine comprises determining a modulation current of the gain section of the tunable laser based on a relationship between the output power of the tunable laser and the modulation current applied to the gain section.

33. The tunable laser system of claim 32, wherein the calibration routine comprises determining a modulation current of the gain section of the tunable laser using:

$$I_{mod} = OMA/S$$

wherein $I_{mod}$ is the modulation current, OMA is an optical modulation amplitude, and S is a slope efficiency of the laser.

34. The tunable laser system of claim 33, wherein the calibration routine comprises determining a bias current of the gain section of the tunable laser using:

$$I_{bias} = \frac{I_{mod}}{ER-1} + \frac{I_{mod}}{2} + I_{th}$$

wherein $I_{bias}$ is the bias current, $I_{mod}$ is the modulation current, ER is a desired extinction ratio of the laser, and $I_{th}$ is a threshold current.

* * * * *